United States Patent
Kwon

(10) Patent No.: US 7,312,612 B2
(45) Date of Patent: Dec. 25, 2007

(54) CIRCUIT FOR DETECTING ELECTRIC CURRENT

(76) Inventor: Yong Jai Kwon, 504 Wonhyung Building, 96-4 Ssangmun 3-dong, Dobong-gu, Seoul, 132-864 (KR)

( * ) Notice: Subject to any disclaimer, the term of this patent is extended or adjusted under 35 U.S.C. 154(b) by 37 days.

(21) Appl. No.: 10/561,172

(22) PCT Filed: Jun. 15, 2004

(86) PCT No.: PCT/KR2004/001426

§ 371 (c)(1),
(2), (4) Date: Dec. 16, 2005

(87) PCT Pub. No.: WO2004/111742

PCT Pub. Date: Dec. 23, 2004

(65) Prior Publication Data

US 2006/0164096 A1    Jul. 27, 2006

Related U.S. Application Data

(63) Continuation of application No. PCT/KR2004/001426, filed on Jun. 15, 2004.

(30) Foreign Application Priority Data

Jun. 16, 2003    (KR)    ........................ 10-2003-0038949

(51) Int. Cl.
*G01R 31/08* (2006.01)

(52) U.S. Cl. ........................ 324/522; 324/713
(58) Field of Classification Search ............... 324/119, 324/522, 713
See application file for complete search history.

(56) References Cited

U.S. PATENT DOCUMENTS 4,422,039 A * 12/1983 Davis ......................... 324/119
4,847,554 A *  7/1989 Goodwin ..................... 324/127
6,710,314 B2 *  3/2004 Reiss et al. .................. 219/633

FOREIGN PATENT DOCUMENTS

| | | |
|---|---|---|
| JP | 58-165674 A | 9/1983 |
| JP | 60-5776 A | 1/1985 |
| JP | 63-117656 A | 5/1988 |
| JP | 10-146050 A | 5/1998 |
| JP | 2003-17287 A | 1/2003 |
| KR | 1994-0001193 Y1 | 4/1993 |

* cited by examiner

*Primary Examiner*—Walter Benson
(74) *Attorney, Agent, or Firm*—Dickstein Shapiro LLP

(57) ABSTRACT

A circuit for detecting an electric current by which a loss portion of a forward current caused by a backward leakage current of a diode generated by the influence of temperature increase can be compensated such that error in the peak value of a load current detected by surrounding high temperature can be minimized, and reliability can be increased for electric instruments that call for an accurate control of the load current and that generate a high temperature such as induction heating cookers, induction heaters and the like.

2 Claims, 8 Drawing Sheets

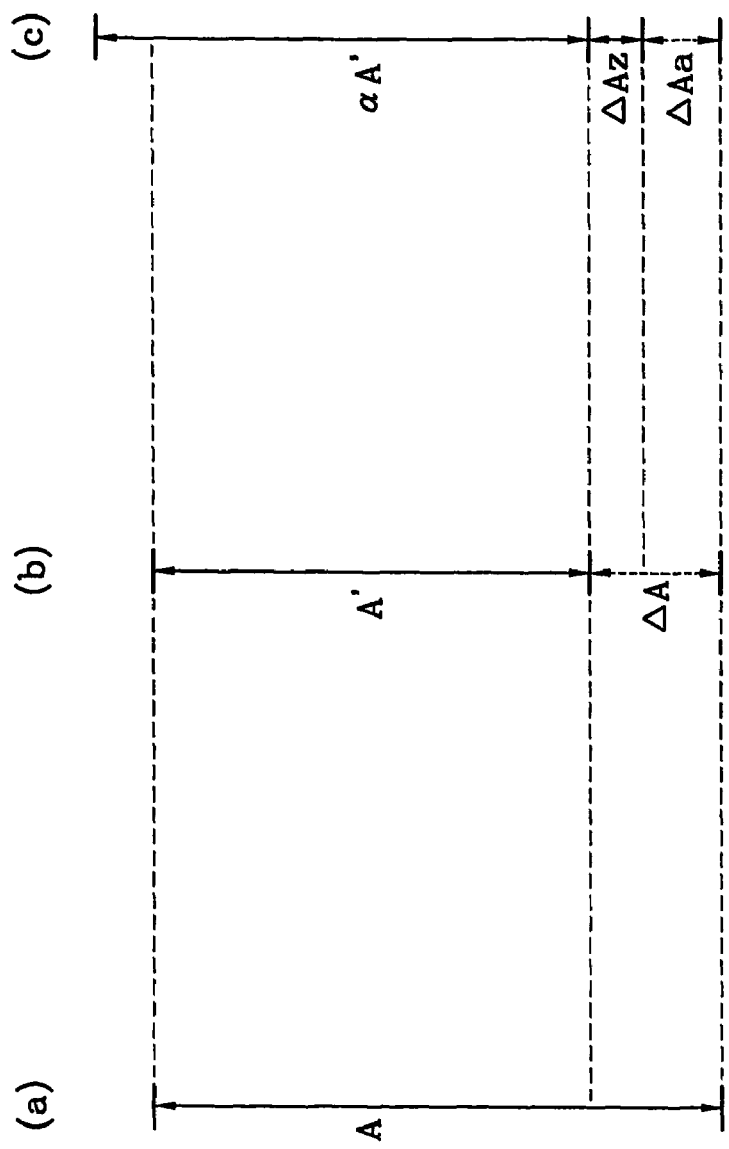

CIRCUIT FOR DETECTING ELECTRIC CURRENT

CROSS REFERENCE TO RELATED APPLICATIONS

This application is a U.S. continuation application filed under 35 U.S.C. §111(a) claiming benefit under 35 U.S.C. §§120 and 365(c) of International Application No. PCT/KR2004/001426, filed on Jun. 15, 2004, which claims benefit of priority from Korean patent application No. 10-2003-0038949, filed on Jun. 16, 2003. The entire contents of the foregoing two applications are hereby incorporated by reference.

FIELD OF THE INVENTION

The present invention relates to a circuit for detecting an electric current and, more particularly, to a circuit for detecting an electric current adapted to compensate a leakage current of a diode sensitive to temperature changes to improve accuracy and minimize errors.

BACKGROUND OF THE INVENTION

As is well known, an increasingly accepted trend of late for electric and electronic gadgets is a requirement for a more accurate load current control in controlling operations thereof. In order to discriminate whether a load current is accurately outputted in relation to a target value, it is necessary to be equipped with a current detecting circuit where the load current is fed back for detection by way of a closed loop method.

As illustrated in FIG. 1, a current detecting circuit according to the prior art includes a current transformer (CT) for receiving a load current to transform same to a small current of easy measurement, a resistor (R1) disposed for establishing an output voltage level of the secondary winding side of the current transformer (CT) as a designed value, a diode (D1) and a capacitor (C1) for half-wave rectifying and smoothening the alternating current output of the secondary winding side of the current transformer (CT) to thereby detect a peak value of a measured current, and an operational amplifier (OA) for buffering the output in relation to the peak value of the measured current detected by the diode (D1) and the capacitor (C1).

Current detection circuits adopted in cookers such as induction heating cookers and the like for heating food contained in cooking containers by flowing current on coils for generation of heat are easily exposed to high heat, whereby the entire temperature of the circuits is increased. An element most sensitive to temperature in the current detection circuits is a diode, and it is a well-known fact that a backward leakage current is increased in the diode as the temperature therein rises.

An ideal forward current (A) flowing in a diode can be explained by FIG. 2(a). However, when the temperature is raised due to the influence of the surrounding temperature, a leakage current (ΔA) flowing backward in the diode is increased to thereby decrease the forward current (A') flowing in the diode (A'=A−ΔA).

In other words, there is a drawback in that an error can occur in the peak value of the load current detected by the diode and the capacitor due to changes of the forward current (A') flowing in the diode.

SUMMARY OF THE INVENTION

The present invention is disclosed to solve the aforementioned drawback and it is an object of the present invention to provide a circuit for detecting an electric current adapted to offset a change in current detection value in relation to an increase of backward leakage current caused by a temperature increase, thereby improving the accuracy of the load current detection and heightening the reliability of products.

In accordance with a first embodiment of the present invention, a circuit for detecting an electric current is constructed to detect a peak value of an input current using a diode having an anode connected to an input side and a cathode connected to an output side and a capacitor having one end connected to the cathode of the diode and the other end being grounded, wherein the circuit further comprises a zener diode having a cathode connected to the cathode of the diode and an anode being grounded.

In accordance with a second embodiment of the present invention, a circuit for detecting a current is constructed to detect a peak value of an input current using a diode having an anode connected to an input side and a cathode connected to an output side and a capacitor having one end connected to the cathode of the diode and the other end being grounded, wherein the circuit further comprises a shunt resistor having one end connected to the cathode of the diode and the other end being grounded.

In accordance with a third embodiment of the present invention, a circuit for detecting a current is constructed to detect a peak value of an input current using a diode having an anode connected to an input side and a cathode connected to an output side and a capacitor having one end connected to the cathode of the diode and the other end being grounded, wherein the circuit further comprises a zener diode having a cathode connected to the cathode of the diode and an anode being grounded, and a shunt resistor having one end connected to the cathode of the diode and the other end being grounded.

BRIEF DESCRIPTION OF THE DRAWINGS

For a better understanding of the nature and objects of the present invention, reference should be made to the following detailed description with the accompanying drawings, in which:

FIG. 8(a) is a schematic drawing for illustrating an ideal forward current value of a diode shown in FIG. 7;

FIG. 8(b) is a schematic drawing for illustrating a backward leakage current value caused due to the influence of temperature and a forward current value decreased by the backward current value in the diode of FIG. 7; and FIG. 8(c) is a schematic drawing for illustrating the state of the forward current value of the diode shown in FIG. 8(b) decreased by a zener diode of FIG. 7 and the state of the forward current value of the diode increased by the shunt resistor shown in FIG. 7.

DETAILED DESCRIPTION OF THE PREFERRED EMBODIMENT

The preferred embodiments of the present invention will now be described in detail with reference to the annexed drawings, where the present embodiments are not limiting the scope of the present invention but is given only as an illustrative purpose.

First Embodiment

Figure 1:
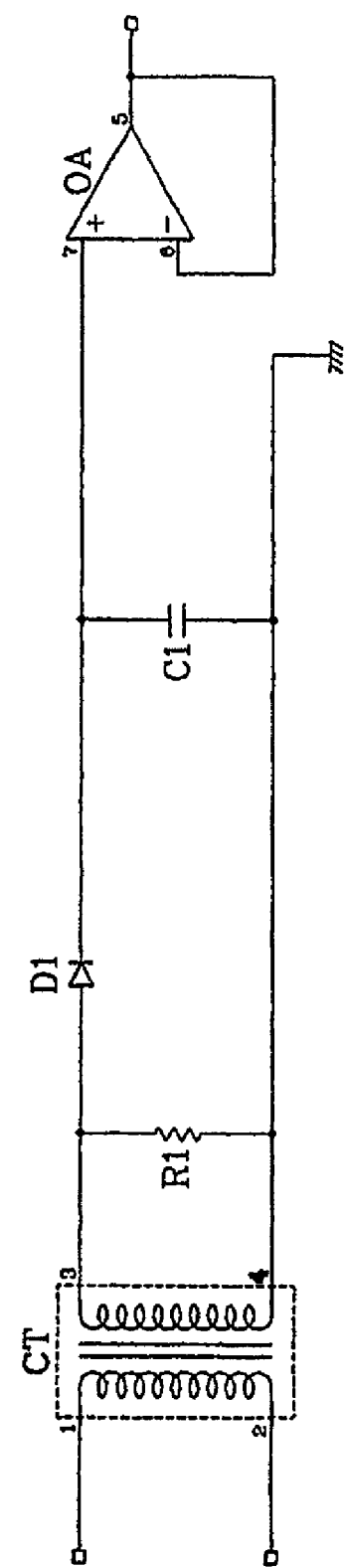
FIG. 1 is a schematic drawing for illustrating a current detecting circuit according to the prior art.
Figure 2:
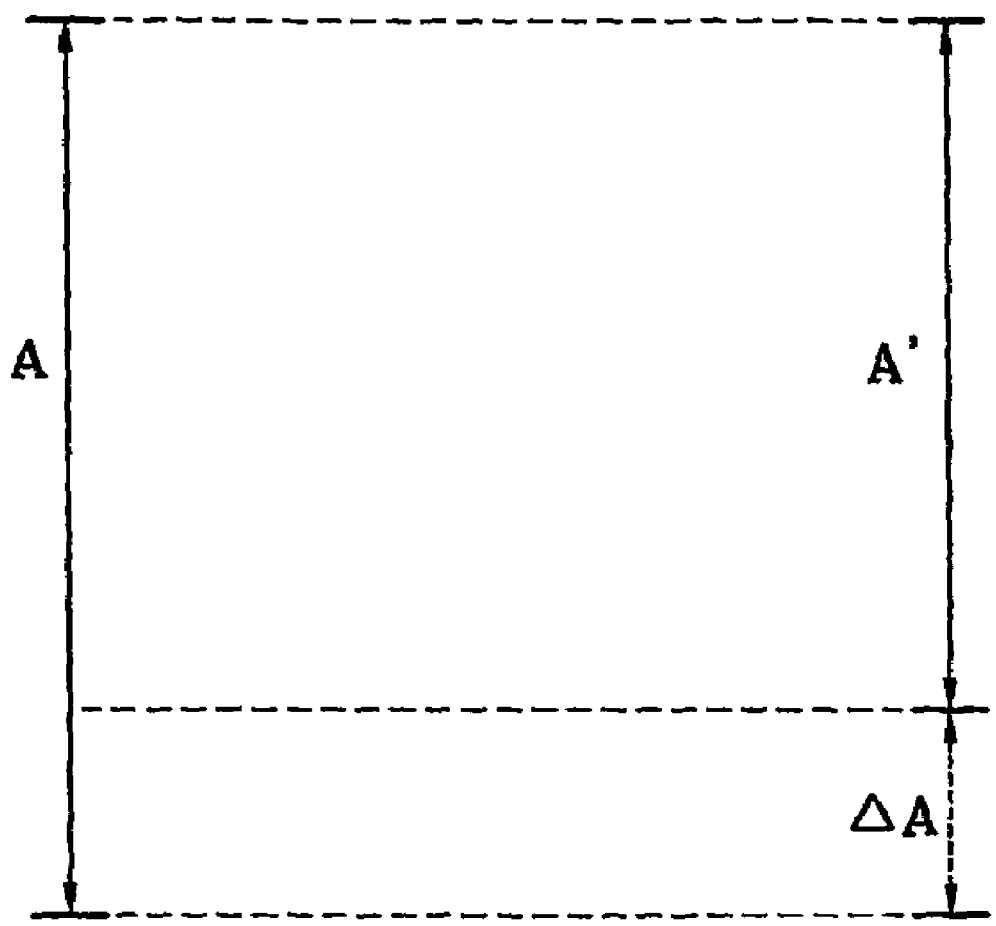
FIG. 2(a) is a schematic drawing for illustrating an ideal forward current value of a diode shown in FIG. 1.
FIG. 2(b) is a schematic drawing for illustrating a backward leakage current value caused due to the influence of temperature and a forward current value decreased by the backward current value in the diode of FIG. 1.
Figure 3:
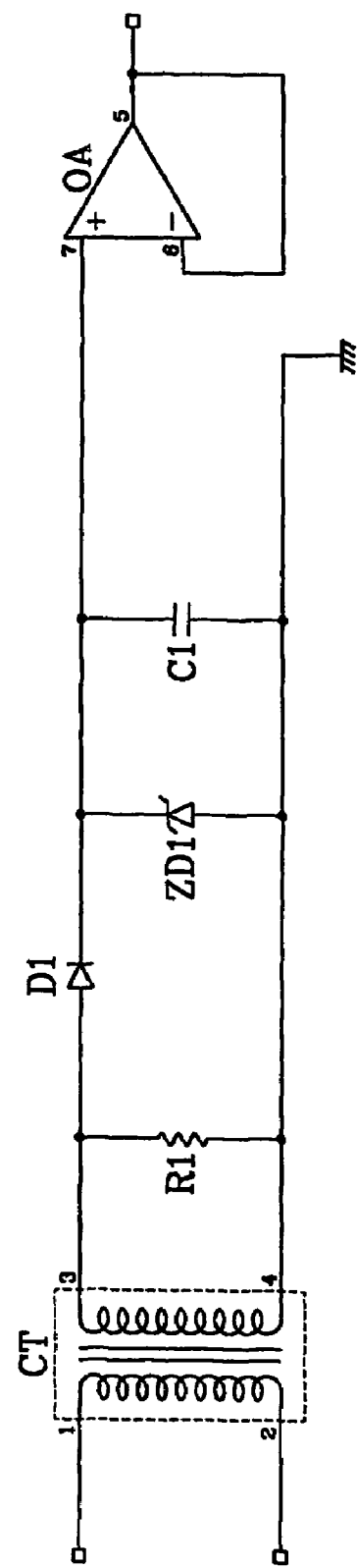
FIG. 3 is a schematic drawing for illustrating a current detecting circuit according to the first embodiment of the present invention.

FIG. 3 is a schematic drawing for illustrating a current detecting circuit according to the first embodiment of the present invention, where the current detecting circuit includes a current transformer (CT), a resistor (R1), a diode (D1), a capacitor (C1), an operational amplifier (OA) and a zener diode (ZD1).

The current transformer (CT) receives a load current and transforms same to a small current that is easy for measurement and outputs same. The resistor (R1) is connected to both ends (3, 4) of a secondary winding of the current transformer (CT) in order to set up an output voltage at the secondary winding of the current transformer (CT).

An anode of the diode (D1) is connected to one end (3) of the secondary winding of the current transformer (CT) and a cathode of the diode (D1) is connected to a non-inversion terminal (7) of the operational amplifier (OA). One end of the capacitor (C1) is connected to a cathode of the diode (D1) and the other end of the capacitor (C1) is grounded.

The non-inversion terminal of the operational amplifier (OA) is connected to the cathode of the diode (D1), a cathode of the zener diode (ZD1), and one end of the capacitor (C1), and an inversion terminal (6) and an output terminal (5) of the operational amplifier (OA) are connected to each other.

The cathode of the zener diode (ZD1) is connected to the cathode of the diode (D1), and the anode of the zener diode (ZD1) is grounded.

The operational effect of the first embodiment of the present invention thus constructed will now be described.

The current transformer (CT) receives the load current of alternating current form at terminals (1, 2) of the first winding and transforms same to a small current of alternating current form for easy measurement and outputs same via terminals (3, 4) at the secondary winding.

The alternating current output to the secondary winding of the current transformer (CT) is half-wave rectified by the diode (D1) and smoothed by the capacitor (C1), and a peak value of current output from the current transformer (CT) is detected by the diode (D1) and the capacitor (C1).

The peak current value detected by the diode (D1) and the capacitor (C1) is buffered by the operational amplifier (OA), delayed momentarily, and is then outputted.

For reference, the peak current value outputted from the operational amplifier (OA) is inputted to a control apparatus (such as a micro computer for controlling a current applied to coils of induction heating cookers or the like) and can be utilized as information for enabling the control apparatus to compare a target value with an actually-outputted load current.

Figure 4:
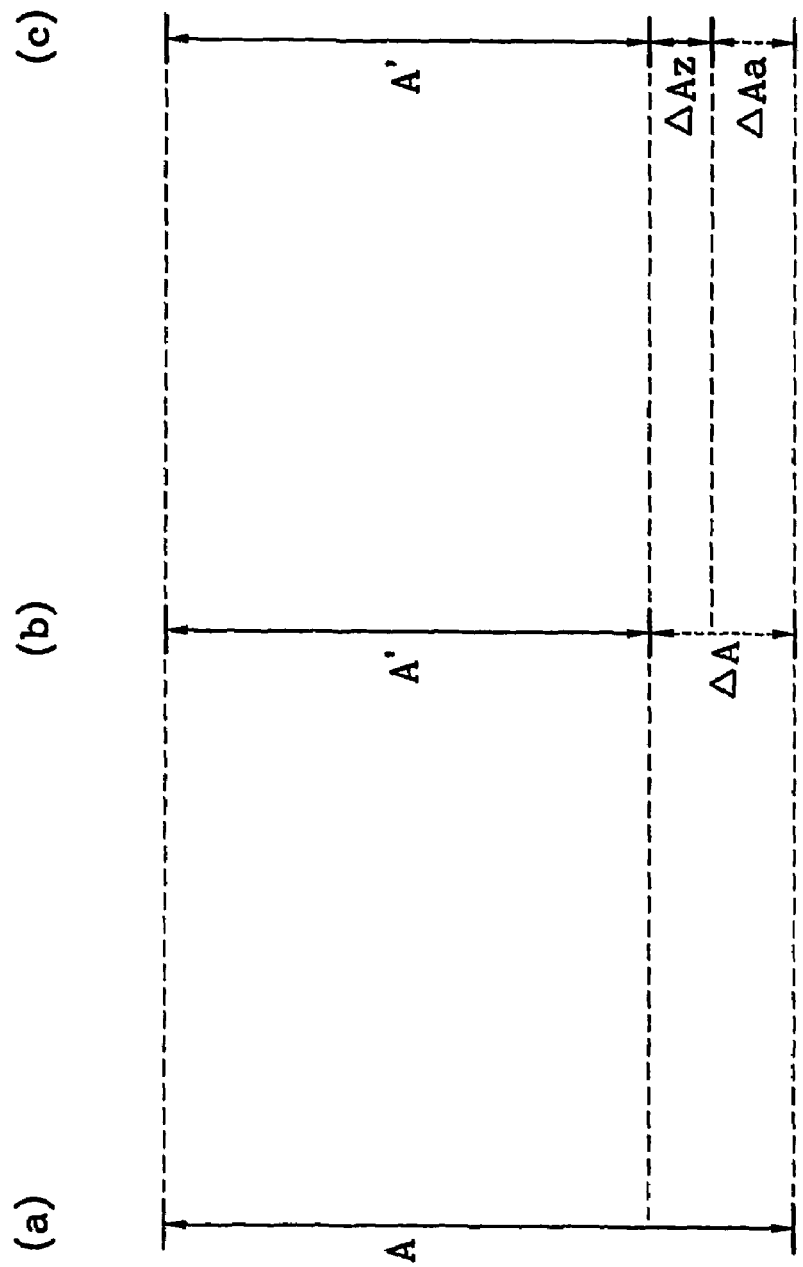
FIG. 4(a) is a schematic drawing for illustrating an ideal forward current value of the diode shown in FIG. 3.
FIG. 4(b) is a schematic drawing for illustrating a backward leakage current value caused due to the influence of temperature and a forward current value decreased by the backward current value in the diode of FIG. 3.
FIG. 4(c) is a schematic drawing for illustrating a state of the backward leakage current value of the diode of FIG. 4(b) decreased by the zener diode of FIG. 3.

When the surrounding temperature is low, a normal forward current (A) flowing from an anode of the diode (D1) to a cathode is a value as shown in FIG. 4(a).

However, if the surrounding temperature of the diode (D1) rises, a backward leakage current ($\Delta A$) flowing from the cathode of the diode (D1) to the anode increases to decrease the forward current (A') of the diode (D1) as illustrated in FIG. 4(b) (A'=A-$\Delta A$).

However, as illustrated in FIG. 4(c), the backward leakage current ($\Delta A$) of the diode (D1) decreases as much as an offset portion ($\Delta Az$) due to the forward current of the zener diode (ZD1) because the forward current of the diode (D1) is added by a forward current flowing to the cathode from the cathode of the zener diode (ZD1), such that the value thereof is reduced to "$\Delta Aa$" ($\Delta Aa=\Delta A-\Delta Az$).

As a result, the loss portion of the forward current of the diode (D1) is greatly reduced, thereby resulting in less errors in the peak value of the detected load current.

Second Embodiment

Figure 5:
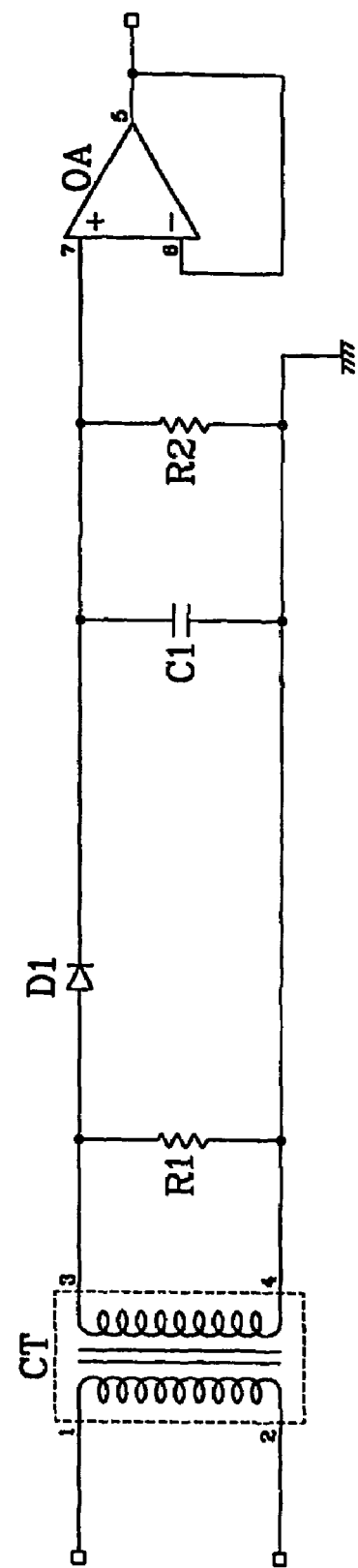
FIG. 5 is a schematic drawing for illustrating a current detecting circuit according to a second embodiment of the present invention.

FIG. 5 illustrates a current detecting circuit according to the second embodiment of the present invention, where the circuit includes a current transformer (CT), a resistor (R1), a diode (D1), a capacitor (C1), an operational amplifier (OA) and a shunt resistor (R2).

The current transformer (CT) receives a load current, transforms same to a small current that is easy for measurement and outputs same. The resistor (R1) is connected to both ends (3, 4) of a secondary winding of the current transformer in order to set up an output voltage at the secondary winding of the current transformer.

An anode of the diode (D1) is connected to one end (3) of the secondary winding of the current transformer and a cathode of the diode (D1) is connected to a non-inversion terminal (7) of the operational amplifier (OA). One end of the capacitor (C1) is connected to a cathode of the diode (D1) and the other end of the capacitor (C1) is grounded.

The non-inversion terminal of the operational amplifier (OA) is connected to the cathode of the diode (D1), one end of the capacitor (C1), and one end of the shunt resistor (R2) and an inversion terminal (6) and an output terminal (5) of the operational amplifier (OA) are connected to each other.

One end of the shunt resistor (R2) is connected to the cathode of the diode (D1), and the other end of the shunt resistor (R2) is grounded.

The operational effect of the second embodiment of the present invention thus constructed will now be described.

The current transformer (CT) receives the load current of alternating current form at terminals (1, 2) of the first winding and transforms same to a small current of alternating current form for easy measurement and outputs same via terminals (3, 4) at the secondary winding.

The alternating current outputted to the secondary winding of the current transformer (CT) is half-wave rectified by the diode (D1) and smoothed by the capacitor (C1), and the peak value of the current output from the current transformer (CT) is detected by the diode (D1) and the capacitor (C1).

The peak current value detected by the diode (D1) and the capacitor (C1) is buffered by the operational amplifier (OA), delayed momentarily and is then outputted.

For reference, the peak current value output from the operational amplifier (OA) is inputted to a control apparatus (such as a micro computer for controlling the current applied to coils of induction heating cookers or the like) and can be utilized as information for enabling the control apparatus to compare a target value with an actually-outputted load current.

Figure 6:
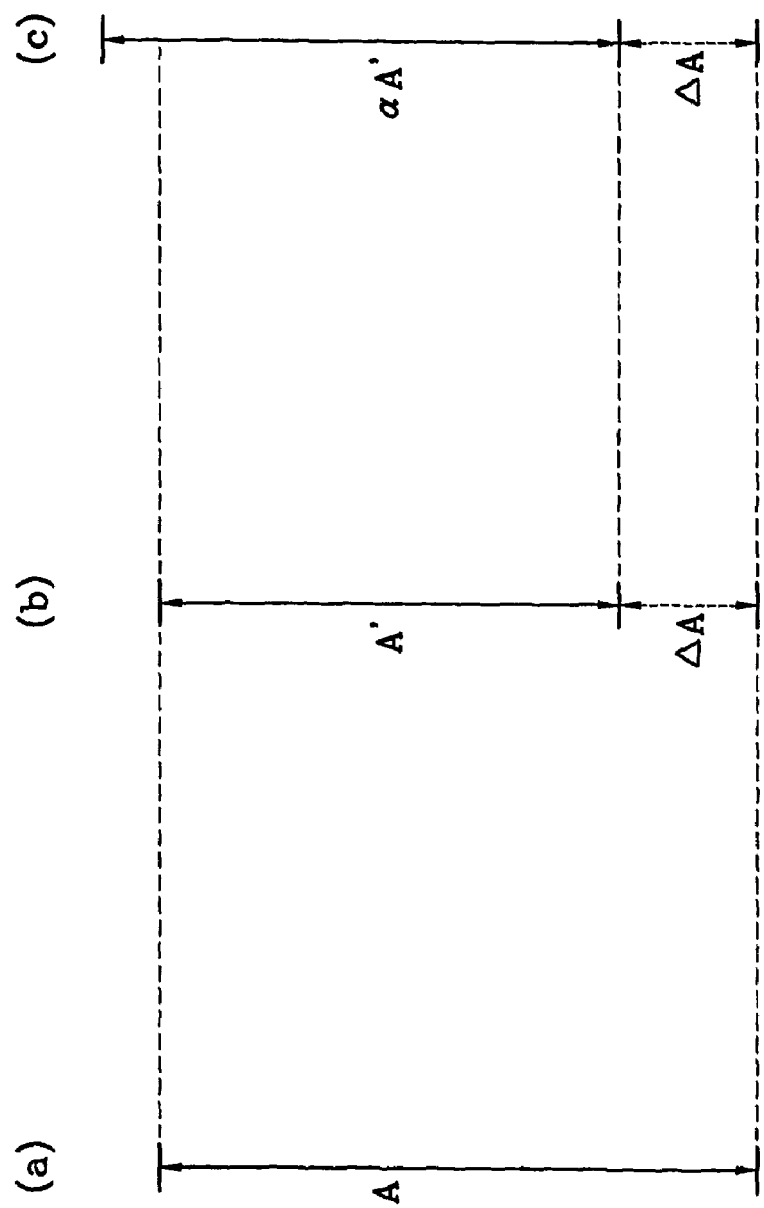
FIG. 6(a) is a schematic drawing for illustrating an ideal forward current value of the diode of FIG. 5.
FIG. 6(b) is a schematic drawing for illustrating a backward leakage current value caused due to the influence of temperature and a forward current value decreased by the backward current value in the diode of FIG. 5.
FIG. 6(c) is a schematic drawing for illustrating a state of the backward current value shown in FIG. 6(c) increased by a shunt resistor of FIG. 5.

When the surrounding temperature is low, a normal forward current (A) flowing from an anode of the diode (D1) to a cathode is a value as shown in FIG. 6(a).

However, if the ambient temperature of the diode (D1) rises, a backward leakage current (ΔA) flowing from the cathode of the diode (D1) to the anode becomes increased to decrease the forward current (A') of the diode (D1) as illustrated in FIG. 6(b) (A=A−ΔA).

However, as illustrated in FIG. 6(c), the forward current (αA') of the diode (D1) is further increased by the installation of the shunt resistor (R2) to offset the loss portion caused by the backward leakage current (ΔA) of the diode (D1), thereby minimizing error in the peak value of the detected load current.

Further elaboration on the operation where the forward current (αA') of the diode (D1) by way of the shunt resistor (R2) is provided below.

Theoretically, a route to the non-inversion terminal (7) of the operational amplifier (OA) from the cathode of the diode (D1) is equivalent to an open circuit without the shunt resistor (R2), such that the current actually flowing through the diode (D1) is relatively weak.

When the shunt resistor (R2) is connected to the cathode of the diode (D1) to be grounded, a closed circuit formed by the cathode of the diode (D1) connected to the ground via the shunt resistor (R2) is constructed, thereby generating a current flowing from the cathode of the diode (D1) to the ground via the shunt resistor (R2).

In other words, the sum of the current flowing via the diode (D1) is further enlarged by the current flowing to the ground side to increase the forward current (αA') of the diode (D1), by which the loss portion caused by the backward leakage current (ΔA) of the diode (D1) can be counterbalanced.

Third Embodiment

Figure 7:
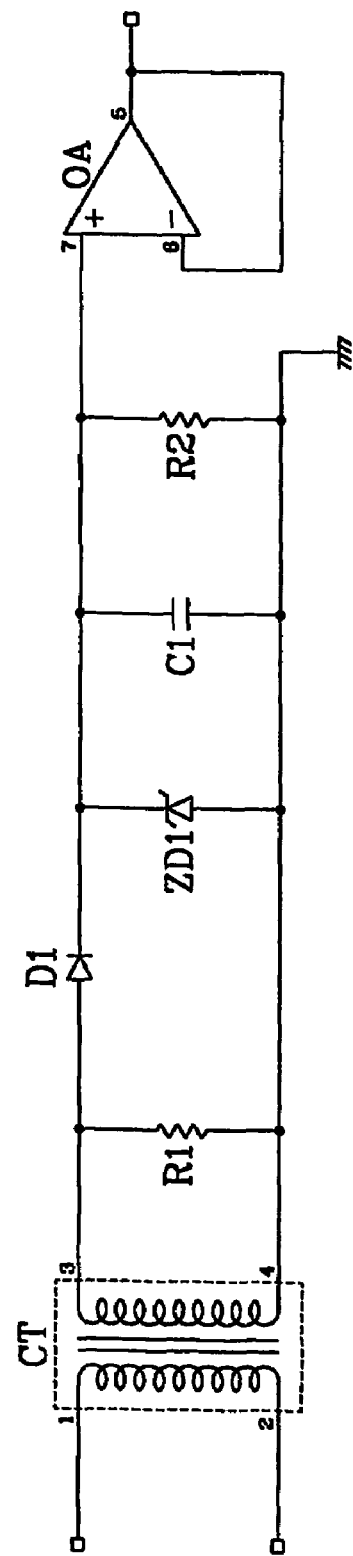
FIG. 7 is a schematic drawing for illustrating a current detecting circuit according to a third embodiment of the present invention.

FIG. 7 illustrates a current detecting circuit according to the third embodiment of the present invention, where the circuit includes a current transformer (CT), a resistor (R1), a diode (D1), a capacitor (C1), an operational amplifier (OA), zener diode (ZD1) and a shunt resistor (R2).

The current transformer (CT) receives a load current and transforms same to a small current that is easy for measurement and outputs same. The resistor (R1) is connected to both ends (3, 4) of a secondary winding of the current transformer in order to set up an output voltage at the secondary winding of the current transformer.

An anode of the diode (D1) is connected to one end (3) of the secondary winding of the current transformer and a cathode of the diode (D1) is connected to a non-inversion terminal (7) of the operational amplifier (OA). One end of the capacitor (C1) is connected to a cathode of the diode (D1) and the other end of the capacitor (C1) is grounded.

The non-inversion terminal of the operational amplifier (OA) is connected to the cathode of the diode (D1), a cathode of the zener diode (ZD1), one end of the capacitor (C1), and one end of the shunt resistor (R2), and an inversion terminal (6) and an output terminal (5) of the operational amplifier (OA) are connected to each other.

A cathode of the zener diode (ZD1) is connected to the cathode of the diode (D1), and an anode of the zener diode (ZD1) is grounded while one end of the shunt resistor (R2) is connected to the cathode of the diode (D1), and the other end of the shunt resistor (R2) is grounded.

The operational effect of the third embodiment of the present invention thus constructed will now be described.

The current transformer (CT) receives the load current of alternating current form at terminals (1, 2) of the first winding and transforms same to a small current of alternating current form for easy measurement and outputs same via terminals (3, 4) at the secondary winding.

The alternating current outputted to the secondary winding of the current transformer (CT) is half-wave rectified by the diode (D1) and smoothed by the capacitor (C1), and a peak value of the current output from the current transformer (CT) is detected by the diode (D1) and the capacitor (C1).

The peak current value detected by the diode (D1) and the capacitor (C1) is buffered by the operational amplifier (OA), delayed momentarily and is then outputted.

For reference, the peak current value output from the operational amplifier (OA) is inputted to a control apparatus (such as a micro computer for controlling the current applied to coils of induction heating cookers or the like) and can be utilized as information for enabling the control apparatus to compare a target value with an actually-outputted load current.

When the surrounding temperature is low, a normal forward current (A) flowing from a anode of the diode (D1) to a cathode is value as shown in FIG. 8(a).

However, if the surrounding temperature of the diode (D1) rises, a backward leakage current (ΔA) flowing from the cathode of the diode (D1) to the anode becomes increased to decrease the forward current (A') of the diode (D1) as illustrated in FIG. 8(b) (A=A−ΔA).

However, as illustrated in FIG. 8(c), when the forward current of the diode (D1) is added by the forward current flowing to the cathode from the cathode of the zener diode (ZD1), the backward leakage current (ΔA) of the diode (D1) is decreased by the forward current of the zener diode (ZD1) as much as an offset portion (ΔAz), such that the value thereof is decreased to "ΔAa" (ΔAa=ΔA−ΔAz).

At the same time, as illustrated in FIG. 8(c), the forward current (αA') of the diode (D1) is further increased by the shunt resistor (R2) to enable to counterbalance the loss portion caused by the backward leakage current (ΔA).

In other words, the loss portion caused by the backward leakage current (ΔAa) of the diode (D1) is first decreased by the forward current of the zener diode (ZD1) in relation to the backward leakage current (ΔA) of the diode (D1).

Second, the forward current (αA') of the diode (D1) is increased by the shunt resistor (R2) to further decrease the loss portion in relation to the backward leakage current (ΔAa) of the diode (D1). As a result, error in relation to the peak value of the detected load current can be minimized.

An elaborate explanation about the operation where the forward current (αA') of the diode (D1) is increased by the shunt resistor (R2) will be described below.

Theoretically, a route to the non-inversion terminal (7) of the operational amplifier (OA) from the cathode of the diode (D1) is equivalent to an open circuit without the shunt resistor (R2), such that the current actually flowing through the diode (D1) is relatively weak.

When the shunt resistor (R2) is connected to the cathode of the diode (D1) to be grounded, a closed circuit formed by the cathode of the diode (D1) connected to the ground via the shunt resistor (R2) is constructed, thereby generating a current flowing from the cathode of the diode (D1) to the ground via the shunt resistor (R2).

In other words, the sum of the current flowing via the diode (D1) is further enlarged by the current flowing to the ground side to increase the forward current (αA') of the diode (D1), by which the loss portion caused by the backward leakage current (ΔA) of the diode (D1) can be counterbalanced.

As apparent from the foregoing, there is an advantage in the circuit for detecting an electric current thus described according to the embodiments of the present invention in that the loss portion of the forward current caused by the backward leakage current of the diode generated by the influence of temperature increase can be compensated such that error in the peak value of load current detected by the surrounding high temperature can be minimized.

There is another advantage in that reliability can be increased for electric instruments that call for an accurate control of the load current and that generate a high temperature such as induction heating cookers, induction heaters and the like.

The foregoing description of the preferred embodiments of the present invention has been presented for the purpose of illustration and description. It is not intended to be exhaustive or to limit the invention to the precise form disclosed, and modifications and variations are possible in light of the above teachings or may be acquired from practice of the invention. It is intended that the scope of the invention be defined by the claims appended hereto, and their equivalents.

What is claimed is:

1. An electric current detection circuit in an induction heating device comprising:

a current transformer having a primary winding connected to a coil of the induction heating device;

a buffer;

a diode configured to detect a peak value of an input current, the diode comprising an anode connected to a secondary winding of the current transformer at an input side of the circuit and a cathode connected to the buffer at an output side of the circuit;

capacitor having one end connected to the cathode of the diode and the other end connected to a ground potential and configured to output a detected peak value of the input current via the buffer at the secondary winding of the current transformer;

a zener diode connected between the diode and the buffer, said zener diode comprising a cathode connected to both the cathode of the diode and an input terminal of the buffer, and an anode connected to a ground potential; and a control apparatus configured to compare a target value with the detected peak value outputted via the buffer and control a current applied to the coil of induction heating device according to a result of the comparing.

2. An electric current detection circuit in an induction heating device comprising:

a current transformer having a primary winding connected to a coil of the induction heating device;

a buffer;

a diode configured to detect a peak value of an input current, the diode comprising an anode connected to a secondary winding of the current transformer at an input side of the circuit and a cathode connected to the buffer at an output side of the circuit;

a capacitor having one end connected to the cathode of the diode and the other end connected to a ground potential and configured to output a detected peak value of the input current via the buffer at the secondary winding of the current transformer;

a zener diode connected between the diode and the buffer, said zener diode comprising a cathode connected to both the cathode of the diode and an input terminal of the buffer and an anode connected to a ground potential;

a shunt resistor having one end connected to both the cathode of the diode and the input terminal of the buffer and the other end connected to a ground potential; and a control apparatus configured to compare a target value with the detected peak value outputted via the buffer and control a current applied to the coil of induction heating device according to a result of the comparing.

* * * * *